United States Patent
Zhong

(10) Patent No.: US 6,399,210 B1
(45) Date of Patent: Jun. 4, 2002

(54) ALKOXYHYDRIDOSILOXANE RESINS

(75) Inventor: Bianxiao Zhong, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 09/723,051

(22) Filed: Nov. 27, 2000

(51) Int. Cl.[7] .................................................. B32B 9/04
(52) U.S. Cl. .......................... 428/447; 528/29; 528/31; 528/33; 521/154; 427/245; 427/387
(58) Field of Search .......................... 428/447; 528/29, 528/31, 33; 521/154; 427/245, 367

(56) References Cited

U.S. PATENT DOCUMENTS

| | | | |
|---|---|---|---|
| 3,615,272 A | 10/1971 | Collins et al. | 23/366 |
| 4,756,977 A | 7/1988 | Haluska et al. | 428/704 |
| 4,999,397 A | 3/1991 | Weiss et al. | 524/755 |
| 5,010,159 A | 4/1991 | Bank et al. | 528/23 |
| 5,063,267 A | 11/1991 | Hanneman et al. | 524/284 |
| 5,416,190 A | 5/1995 | Mine et al. | 528/492 |
| 5,494,859 A | 2/1996 | Kapoor | 437/235 |
| 5,776,990 A | 7/1998 | Hedrick et al. | 521/77 |
| 6,022,814 A | 2/2000 | Mikoshiba et al. | 438/789 |
| 6,143,360 A | 11/2000 | Zhong | 427/244 |
| 6,143,855 A * | 11/2000 | Hacker et al. | 528/31 |
| 6,184,260 B1 * | 2/2001 | Zhong | 521/77 |
| 6,218,497 B1 * | 4/2001 | Hacker et al. | 528/31 |

FOREIGN PATENT DOCUMENTS

| | | | |
|---|---|---|---|
| EP | 0 775 669 A2 | 5/1997 | C01B/13/32 |
| JP | 10287746 | 10/1998 | C08G/77/04 |
| WO | WO 98/49721 | 11/1998 | H01L/21/316 |

OTHER PUBLICATIONS

Mikoshiba et al., Journal of Materials Chemistry, "Preparation of low density poly(methylsilsesquioxanes)s for LSI interlayer dielectrics with low dielectric constant. Fabrication of Angstrom size pores prepared by baking trifluoropropylsilyl copolymers", 1999, 9, 591–598.

* cited by examiner

Primary Examiner—Robert Dawson
Assistant Examiner—Michael J Feely
(74) Attorney, Agent, or Firm—Sharon K. Severance; Rick D. Streu

(57) ABSTRACT

An alkoxyhydridosiloxane resin composition comprising $ROSiO_{3/2}$ siloxane units and $HSiO_{3/2}$ siloxane units wherein R is an alkyl group having 10 to 28 carbon atoms, wherein the alkoxyhydridosiloxane resin contains an average from 5 to 40 mole percent silicon bonded alkoxy groups, and wherein the alkoxyhydridosiloxane resin contains an average of at least 45 mole percent silicon bonded hydrogen atoms. While not represented by the structure, the resins may also contain a small number of atoms which have either 0 or 2 hydrogen atoms attached thereto and/or a small number of SiC groups such as $CH_3SiO_{3/2}$ or $HCH_3SiO_{2/2}$ groups. These resins are useful for forming nanoporous silicone resin coatings having low dielectric constant coatings useful for electrical insulating coatings on electronic devices.

20 Claims, No Drawings

ALKOXYHYDRIDOSILOXANE RESINS

FIELD OF THE INVENTION

This invention relates to alkoxyhydridosiloxane resins and a method of making alkoxyhydridosiloxane resins by reacting a hydridosiloxane resin with an alcohol having about 10 to 28 carbon atoms. The alkoxyhydridosiloxane resin contains an average from 5 to 40 mole percent silicon bonded alkoxy groups and an average of at least 45 mole percent silicon bonded hydrogen atoms. The present invention also relates to nanoporous coatings produced from the alkoxyhydridosiloxane resins having a dielectric constant (Dk) ranging from about 1.5 to 3.

BACKGROUND OF THE INVENTION

Semiconductor devices often have one or more arrays of patterned interconnect levels that serve to electrically couple the individual circuit elements forming an integrated circuit (IC). The interconnect levels are typically separated by an insulating or dielectric coating. Previously, a silicon oxide coating formed using chemical vapor deposition (CVD) or plasma enhanced techniques (PECVD) was the most commonly used material for such dielectric coatings. However, as the size of circuit elements and the spaces between such elements decreases, the relatively high dielectric constant of such silicon oxide coatings (i.e. about 4) is inadequate to provide adequate electrical insulation.

In order to provide a lower dielectric constant than that of silicon oxide, dielectric coatings formed from siloxane-based resins have found use. An example of such coatings are those formed from hydrogen silsesquioxane resins as described for example in Collins et al., U.S. Pat. No. 3,615,272 and Haluska et al. U.S. Pat. No. 4,756,977. While such coatings provide lower dielectric constants than CVD or PECVD silicon oxide coatings and also provide other benefits such as enhanced gap filling and surface planarization, typically the dielectric constants of such coatings are limited to approximately 3 or greater.

Chung et al., U.S. patent application Ser. No. 09/197,249 describe a method for forming a porous coating from hydrogen silsesquioxane resins. A porous network is formed by depositing a coating on a substrate with a solution comprising a hydrogen silsesquioxane resin and a solvent in a manner in which at least 5 volume % of the solvent remains in the coating after deposition. The coating is then exposed to an environment comprising a basic catalyst and water; the solvent is evaporated from the coating to form a porous network with a dielectric constant in the range of about 1.5 to 2.4.

It is well known that the dielectric constant of insulating coatings is an important factor where IC's with low power consumption, cross talk, and signal delay are required. As IC dimensions continue to shrink, this factor increases in importance. As a result, siloxane based resin materials and methods for making such materials that can provide electrically insulating coatings with dielectric constants below 3 are desirable. In addition it is desirable to have siloxane-based resins and methods for making such resins that provide coatings which have a high resistance to cracking. Also, it is desirable for such siloxane-based resins to provide coatings by standard processing techniques.

It is known that the dielectric constant of solid coatings decrease with a decrease in density of the coating material. A porous coating typically has a lower density than a corresponding solid coating.

Kapoor, U.S. Pat. No. 5,494,859, describes an insulating layer for an integrated circuit structure and a method of making the layer. A porous layer is formed by depositing a composite layer on a structure comprising an insulating matrix material such as a polysilicon/carbon layer which can be converted to a porous $SiO_2$ layer by oxidation having a Dk of less than about 3.9, the carbon being oxidized to produce gaseous $CO_2$, which may escape from the matrix.

Smith et al., WO 98/49721, describe a process for forming a nanoporous dielectric coating on a substrate. The process comprises the steps of blending an alkoxysilane with a solvent composition and optional water; depositing the mixture onto a substrate while evaporating at least a portion of the solvent; placing the substrate in a sealed chamber and evacuating the chamber to a pressure below atmospheric pressure; exposing the substrate to water vapor at a pressure below atmospheric pressure and then exposing the substrate to base vapor.

Mikoshiba et al., Japanese Laid-Open Patent (HEI) 10-287746, describe the preparation of porous coatings from siloxane-based resins having organic substituents that are oxidized at a temperature of 250° C. or higher. The useful organic substituents that can be oxidized at a temperature of 250° C. or higher that were disclosed include substituted and unsubstituted groups as exemplified by 3,3,3-triflouropropyl, β-phenethyl group, t-butyl group, 2-cyanoethyl group, benzyl group, and vinyl group.

Mikoskiba et al., *J. Mat. Chem.*, 1999, 9, 591–598, report a method to fabricate angstrom size pores in poly (methylsilsesquioxane) coatings in order to decrease the density and the dielectric constant of the coatings. Copolymers bearing methyl (trisiloxysilyl) units and alkyl (trisiloxysilyl) units are spin-coated on to a substrate and heated at 250° C. to provide rigid siloxane matrices. The coatings are then heated at 450° C. to 500° C. to remove thermally labile groups and holes are left corresponding to the size of the substituents. Trifluoropropyl, cyanoethyl, phenylethyl, and propyl groups were investigated as the thermally labile substituents.

It has now been found that nanoporous coatings produced from alkoxyhydridosiloxane resins wherein about 5 to 40 mole percent of total siloxane groups are substituted with at least one alkoxy group having about 10 to 28 carbon atoms and at least 45 mole percent of total siloxane groups are substituted with at least one hydrogen atom are useful for electrical insulating coatings. These nanoporous coatings have the advantage of using conventional thin coating processing and result in a dielectric constant in the range of about 1.5 to 3.0.

SUMMARY OF THE INVENTION

This invention relates to alkoxyhydridosiloxane resins and a method of making alkoxyhydridosiloxane resins by reacting a hydridosiloxane resin with an alcohol having about 10 to 28 carbon atoms using a base catalyst. The alkoxyhydridosiloxane resin contains an average from about 5 to 40 mole percent silicon bonded alkoxy groups and an average of at least 45 percent silicon bonded hydrogen atoms.

This invention further relates to a method of forming a nanoporous coating on a substrate by heating the alkoxyhydridosiloxane resin at a temperature sufficient to effect thermolysis of the alkoxy groups and thereby forming a nanoporous coating having a dielectric constant in the range of about 1.5 to 3.0.

DETAILED DESCRIPTION OF THE INVENTION

An alkoxyhydridosiloxane resin composition according to this invention comprises $ROSiO_{3/2}$ siloxane units and HSiO$_{3/2}$ siloxane units wherein R is an alkyl group having 10 to 28 carbon atoms, wherein the resin contains an average from 5 to 40 mole percent silicon bonded alkoxy groups, and wherein the resin contains an average of at least 45 mole percent silicon bonded hydrogen atoms.

While not represented by the structure, the resins may also contain a small number of siloxane units which have either 0 or 2 hydrogen atoms attached thereto and/or a small number of SiC groups such as CH$_3$SiO$_{3/2}$ or HCH$_3$SiO$_{2/2}$ groups. It is preferred that the alkoxyhydridosiloxane resin contain at least 70 mole percent silicon bonded hydrogen atoms.

The method for preparing the alkoxyhydridosiloxane resin comprises reacting a silicon bonded hydrogen of a hydridosiloxane resin with an alcohol having about 10 to 28 carbon atoms in the presence of a base catalyst for a time sufficient to effect formation of an alkoxyhydridosiloxane resin. The hydridosiloxane resin can be any of those known in the art where at least 50 percent of the silicon atoms have a hydrogen substitution and as such can be homopolymers or copolymers. The structure of the resin is not specifically limited, however hydrogen silsesquioxane resins are preferred. The resins may contain end groups such as hydroxyl groups, triorganosiloxy groups, diorganohydrogensiloxy groups, trialkoxy groups, dialkoxy groups and others. Although not represented by this structure, these resins may also contain a small number (e.g., less than about 10%) of silicon atoms which have either 0 or 2 hydrogen atoms attached thereto or a small number of SiC groups such as CH$_3$SiO$_{3/2}$ or HCH$_3$SiO$_{2/2}$ groups. Useful resins may be exemplified by, but not limited to:

(HSiO$_{3/2}$)$_n$,
(HSiO$_{3/2}$)$_x$(R$^1$SiO$_{3/2}$)$_y$,
(HSiO$_{3/2}$)$_x$(R$^1$R$^2$SiO)$_y$,
(HSiO$_{3/2}$)$_x$(R$^1$R$^2$SiO)$_y$(SiO$_2$)$_z$, and
(HSiO$_{3/2}$)$_x$(H$_2$SiO)$_y$ wherein R$^1$ is a substituent which is not removed by heating at a temperature up to about 600° C. R$^1$ is exemplified by, but not limited to, alkyl such as methyl, ethyl, propyl, aryl such as phenyl and unsaturated hydrocarbon such as vinyl or allyl or any of the above groups substituted with substituents such as halogens, alkyls or aryls including, for example phenylethyl or chloromethyl. R$^2$ is R$^1$ or hydrogen, n is greater than or equal to 8, the mole fractions, x, y, and z, total 1 in each of the above copolymers and x is at least 0.5 of the sum of x, y, and z. Preferred is when the hydridosiloxane resin is selected from the group of resins described by formulas (HSiO$_{3/2}$)$_n$ and (HSiO$_{3/2}$)$_x$(H$_2$SiO)$_y$; where n, x, and y are as described above. A preferred weight average molecular weight for the hydridosiloxane resin is between 1000 and 150,000 with a preferred range between 20,000 and 100,000.

The above hydridosiloxane resins and methods for their production are known in the art. For example, Collins et al. in U.S. Pat. No. 3,615,272, which is incorporated herein by reference, teach the production of a nearly fully condensed hydridosiloxane resin (which may contain up to 100–300 ppm silanol) by a process comprising hydrolyzing trichlorosilane in a benzenesulfonic acid hydrate hydrolysis medium and then washing the resultant resin with water or aqueous sulfric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference; those produced by hydrolyzing an alkoxy or acyloxy silane in an acidic, alcoholic hydrolysis medium; or any other equivalent hydridosiloxane, will also function herein. Specific molecular weight fractions of the above H-resins may also be used in this process. Such fractions and methods for their preparation are taught in U.S. Pat. No. 5,063,267 to Hanneman et al. and in U.S. Pat. No. 5,416,190 to Mine et al.

The hydridosiloxane resin is reacted with an alcohol having about 10 to 28 carbon atoms to form the alkoxyhydridosiloxane resin. The alcohol serves to provide the silicon bonded alkoxy (RO) group on the alkoxyhydridosiloxane resin. The alcohol can be primary or secondary, straight chained or branched, and substituted or unsubstituted. Substituted alcohols include those for example having acyloxy substitution such as described by formula HO(CH$_2$)$_a$OC(O)(CH$_2$)$_b$CH$_3$ or HO(CH$_2$)$_a$CH(O$_2$CCH$_3$)(CH$_2$)$_b$CH$_3$, alkoxycarbonyl substitution such as described by formula HO(CH$_2$)$_a$C(O)O(CH$_2$)$_b$CH$_3$ or HO(CH$_2$)$_a$CH (OCH$_3$)(CH$_2$)$_b$CH$_3$, alkoxy substitution such as described by formula HO(CH$_2$)$_a$O(CH$_2$)$_b$CH$_3$, carbonyl substitution such as described by formula HO(CH$_2$)$_a$C(O)(CH$_2$)$_b$CH$_3$, and cycloalkyl substitution such as described by formula HO(CH$_2$)$_a$R$^3$ where R$^3$ is a cycloalkyl group comprising about 5 to 10 carbon atoms, a≧0, b≧0.

When the alcohol is a primary alcohol it has a higher reactivity toward the hydridosiloxane resin than a secondary alcohol with a comparable number of carbon atoms. When the alcohol is branched the resulting branched alkoxy groups substituted on the alkoxyhydridosiloxane resin release lower molecular weight hydrocarbon components during thermolysis than linear alkoxy substitutents having a comparable number of carbon atoms and thus the thermolysis products are more easily removed from the cured nanoporous siloxane resins. Examples of unsubstituted alcohols useful in this process include 1-decanol, 1-dodecanol, 1-octadecanol and 2-octyldodecanol, with 1-octadecanol and 2-octyldodecanol being preferred, and 2-octyldodecanol being most preferred.

After the reaction of the silicon bonded hydrogen of the hydridosiloxane resin with the alcohol at least about 45 mole percent silicon bonded hydrogen atoms should remain to retain curing ability of the silicon resin. One skilled in the art would understand that this amount of silicon bonded hydrogen atoms in the resin can be achieved by adding an amount of alcohol such that the mole percent of silicon bonded alkoxy groups are between about 5 to 40 mole percent.

The mole percent silicon bonded alkoxy groups of the alkoxyhydridosiloxane resin used to prepare the nanoporous coating has an effect on the dielectric constant of the nanoporous coating. Generally, for a specific alkoxy group, the dielectric constant increases with increasing mole percent silicon bonded alkoxy groups. The dielectric constant also varies with the specific alkoxy groups on the alkoxyhydridosiloxane resin (i.e. which alcohol is used as a source of alkoxy). As such the mole percent range of silicon bonded alkoxy groups suitable for a specific alkoxyhydridosiloxane resin would be readily determined by one skilled in the art. Typically a mole percent of silicon bonded alkoxy from about 10 to 30 would result in a dielectric constant from about 1.5 to 2.5 depending on the specific alkoxy group.

The base catalyst can be any base catalyst effecting the dehydrogenation reaction between a silicon bonded hydrogen atom in a hydridosiloxane resin and an alcohol. A preferred catalyst is an organic base such as an amine, N(R$^4$)$_3$, where R$^4$ is an alkyl group with 1 to 28 carbon atoms or H. Examples include triethyl amine, ammonia, trihexylamine, trioctylamine, triisooctylamine, triisodecylamine and dioctylamine. If the alkoxyhydridosilxoane resin is coated on an electronic substrate, metal-containing bases such as NaOH are not desirable because of the possible metal contamination to the electronic substrate.

The amount of a base catalyst useful in this method is not narrowly limited as long as there is a sufficient amount present to accelerate a reaction between silicon-bonded hydrogen atoms present on the hydridosiloxane and the alcohol. The amount of the base catalyst will depend upon the particular catalyst used. In general as low as about 0.00005 parts by weight of the catalyst for every part by weight of the hydridosiloxane resin can be used. Preferably the amount of the base catalyst is at least about 0.001 parts by weight on the same basis, with about 0.002 to 0.01 parts by weight on the same basis being more preferred.

The temperature at which the hydridosiloxane resin is reacted with the alcohol is not critical as long as it does not cause significant gelation or affect the curing of the alkoxyhydridosiloxane resin product. Generally the temperature can be within a range of about 20° C. to 150° C., with a temperature within a range of about 50° C. to 100° C. being preferred. As one skilled in the art would readily understand, the time sufficient to effect formation of the alkoxyhydridosiloxane resin would be dependent upon a number of factors such as, but not limited to; the specific alcohol being used, the temperature and the mole percent of alkoxy desired in the alkoxyhydridosiloxane product of the reaction.

Optionally, the base catalyst can be neutralized with an acid after the reaction. Any inorganic or organic acid may generally be used. Examples include HCl, $CF_3COOH$, $CH_3COOH$ and octanoic acid. The amount of the acid used should be just enough to neutralize all the base present, for example with the moles of proton atoms in the acid equal to the moles of the base.

It is preferred that the hydridosiloxane resin be diluted in a solvent that is not detrimental to the reaction with the alcohol. The solvent can generally be any non-aromatic solvent or aromatic solvent that does not contain functional groups which may participate in the reaction, such as a hydroxyl group. Examples of useful organic solvents include alkanes such as dodecane, n-pentane, hexane, n-heptane, and isooctane; cycloalkanes such as cyclopentane and cyclohexane; aromatics such as benzene, toluene, xylene, and mesitylene; ketones such as methylisobutylketone; halogen substituted alkanes such as trichloroethane; and halogen substituted aromatics such as bromobenzene and chlorobenzene. Additionally, combinations of the above organic solvents may be used together as co-solvents for the hydridosiloxane resin. The preferred organic solvents are aromatic compounds because of their high volatility, with toluene and mesitylene being most preferred because of their safety profile.

It is preferred that the hydridosiloxane resin be diluted in the organic solvent within a range of about 5 to 60 weight percent as resin. More preferred is when the hydridosiloxane resin is diluted in the solvent within a range of about 10 to 30 weight percent as resin.

This invention also relates to a method for preparing a nanoporous coating on a substrate from the alkoxyhydridosiloxane resin. The alkoxyhydridosiloxane resin is typically applied to a substrate as a solvent dispersion. Solvents which may be used include any agent or mixture of agents which will dissolve or disperse the resin to form a homogeneous liquid mixture without affecting the resulting coating or the substrate. The solvent can generally be any non-aromatic solvent or aromatic solvent that does not contain functional groups which may participate in the reaction, such as a hydroxyl group, exemplified by those discussed herein above for the hydridosiloxane reaction with alcohol.

The solvent is present in an amount sufficient to dissolve the alkoxyhydridosiloxane resin to the concentration desired for application. Typically the solvent is present in an amount of 40 to 95 weight percent, preferably from 70 to 90 weight percent based on the weight of resin and solvent.

The alkoxyhydridosiloxane resin formed by reaction of a silicon bonded hydrogen of the hydridosiloxane and alcohol described herein above may be retained as a solution in the reaction solvent or if desired a simple solvent exchange may be performed by adding a secondary solvent and distilling off the first. Alternatively, the solid form of the alkoxyhydridosiloxane resin may be recovered by removing the solvent by a standard process such as azeotropic distillation. Specific methods for application of the alkoyhydridosiloxane resin to a substrate include, but are not limited to spin coating, dip coating, spray coating, flow coating, screen printing or others. The preferred method for application is spin coating. When a solvent is used, the solvent is allowed to evaporate from the coated substrate resulting in the deposition of an alkoxyhydridosiloxane resin coating on the substrate. Any suitable means for evaporation may be used such as simple air drying by exposure to an ambient environment, by the application of a vacuum, or mild heat (<50° C.) or during the early stages of the curing process. It should be noted that when spin coating is used, the additional drying method is minimized as the spinning drives off the solvent.

Following application to the substrate, the alkoxyhydridosiloxane resin coating is heated at a temperature sufficient to effect cure of the resin and thermolysis of alkoxy groups from the silicon atoms. By "cure" it is meant a coating that is essentially insoluble in the solvent from which the alkoxyhydridosiloxane resin is deposited onto the substrate or any solvent delineated above as being useful for the application of the alkoxyhydridosiloxane resin. As described herein "thermolysis" refers to heating at a temperature range such that the alkoxy groups bonded to silicon are essentially removed resulting in volatile hydrocarbons and hydrocarbon fragments. The thermolysis generates voids in the coating, resulting in the formation of a nanoporous resin. The heating may be conducted in a single single-step process or in a two-step process. In the two-step heating process the alkoxyhydridosiloxane resin is first heated at a temperature sufficient to effect curing without significant thermolysis of the alkoxy groups. Generally this temperature can be in a range of from about 20° C. to 350° C. Then, the cured alkoxyhydridosiloxane resin coating is further heated at a temperature within a range of greater than about 350° C. up to the lesser of the decomposition temperature of the silicon resin polymer backbone or $R^1$ substituents on the silicon atoms as described herein above to effect thermolysis of the alkoxy from the silicon atoms. Generally, it is preferred that the thermolysis step be conducted at a temperature in a range of greater than about 350° C. to about 600° C., with a temperature in a range of about 400° C. to 550° C. being most preferred.

In the single-step heating process the curing of the alkoxyhydridosiloxane resin and thermolysis of the alkoxy groups are effected simultaneously by heating the alkoxyhydridosiloxane resin to a temperature within a range of greater than about 350° C. up to the lesser of the decomposition temperature of the silicone resin polymer backbone or $R^1$ substituents on the silicon atoms as described herein above. Generally, it is preferred that the single-step method of heating be conducted at a temperature in a range of greater than about 350° C. to 600° C., with a temperature in a range of about 400° C. to 550° C. being most preferred.

It is preferred that the heating be conducted in an inert atmosphere. The inert atmosphere is useful because the presence of oxygen may oxidize Si—H bonds and cause the formation of silanol groups resulting in an increased dielectric constant (Dk) for the resin. The inert atmosphere can be any of those known in the art, for example argon, helium, or nitrogen with an oxygen level less than 50 parts per million and preferably less than 15 parts per million.

By the above method a thin (less than 2.5 microns) nanoporous coating is produced on the substrate. Preferably the coatings have a thickness of 0.3 to 1.2 microns. The coating smoothes the irregular surfaces of the various substrates and has excellent adhesion properties.

The nanoporous coatings produced herein may be produced on any substrate. However, the coatings are particularly useful on electronic substrates. By "electronic substrate" it is meant to include silicon based devices and gallium arsenide based devices intended for use in the manufacture of a semiconductor component including focal plane arrays, opto-electronic devices, photovoltaic cells, optical devices, transistor-like devices, 3-D devices, silicon-on-insulator devices, super lattice devices and the like.

The electronic substrates can be bare (i.e. no passivation), can have primary passivation or can contain one or more layers of metallization which may be bare or covered with one or more liner layers. Such primary passivation and liners can be ceramic coatings such as silica, silicon nitride, silicon carbide, silicon oxynitride, silicon oxycarbide, PSG, BPSG, and others. Primary passivation coatings and liners and methods for producing them are known to those skilled in the art. The coatings produced herein may be applied to a wafer prior to the application of any metallization. The coatings may be applied over metallization as an interlevel or interlayer dielectric or the coatings may be applied as a top passivation coating to complete the formation of the device.

Additional coatings may be applied over the insoluble coating if desired. These can include, for example $SiO_2$ coatings, silicon containing coatings, silicon carbon containing coatings, silicon nitrogen containing coatings, silicon oxygen nitrogen containing coatings, silicon nitrogen carbon containing coatings and/or diamond like coatings produced from deposition (i.e. CVD, PECVD, etc.) of amorphous SiC:H, diamond, silicon nitride. Methods for the application of such coatings are known in the art.

The method of applying an additional coating is not critical, and such coatings are typically applied by chemical vapor deposition techniques such as thermal chemical vapor deposition (TCVD), photochemical vapor deposition, plasma enhanced chemical vapor deposition (PECVD), electron cyclotron resonance (ECR), and jet vapor deposition. The additional coatings can also be applied by physical vapor deposition techniques such as sputtering or electron beam evaporation. These processes involve either the addition of energy in the form of heat or plasma to a vaporized species to cause the desired reaction, or they focus energy on a solid sample of the material to cause its deposition.

The nanoporous coatings formed by this method are particularly useful as coatings on electronic devices such is integrated circuits. The dielectric constant of these coatings ranges from about 1.5 to 3, with 1.5 to 2.5 being more preferred. By the term "nanoporous" it is meant a coating have a median pore diameter in the range of about 0.1 nm to 20 nm. A preferred embodiment of this invention is an electronic substrate having a nanoporous coating of the resin. In a preferred embodiment of the invention, the nanoporous resin coating preferably has a median pore diameter within a range of about 0.3 nm to 2 nm.

EXAMPLES

The following non-limiting examples are provided so that one skilled in the art may more readily understand the invention.

Example 1

A solution was prepared containing 0.84 parts by weight of 2-octyl-1-dodecanol, 8.4 parts by weight of toluene solvent, 1 part by weight of a hydrogen silsesquioxane resin having a weight average molecular weight of 70,000, prepared by the method of Collins et al., U.S. Pat. No. 3,615,272 and 0.006 parts by weight of di-n-octylamine as base catalyst per weight of the resin. The resin was reacted with the alcohol at 90° C. for 10 minutes. The base catalyst was then neutralized with 0.0036 parts by weight of octanoic acid per weight part of the of the starting hydrogen silsesquioxane resin. The resulting solution was filtered through a filter with a pore size of 0.45 microns. A sample of 6 g of the solution was placed into a ceramic crucible, heated at 350° C. in nitrogen for 0.5 hour, and then heated at 500° C. in nitrogen for 1 hour. The resulting solid was tested for nitrogen adsorption at −196° C. using a Micromeritics ASAP 2000 Accelerated Surface Area and Porosimetry System. Porosity was calculated from its total pore volume obtained from the adsorption analysis using a density of 1.5 g/cc for the untreated resin solid. The BET surface area was 721 m2/g. Porosity was 33%. Median pore diameters for the cured solid, 0.70 nm, was calculated by H-K analysis (Horvath, J. Chem. Eng. Japan, 1983, Vol. 16, page 476) of the nitrogen adsorption data.

Another sample of the filtered solution was coated onto 4 inch silicon wafers at a spin rate of 1000 RPM with a spin time of 20 seconds the coated wafer was heated in an essentially nitrogen atmosphere at 450° C. for 20 minutes. Then its dielectric constant (Dk) was measured and determined to be 2.14.

Example 2

Samples were prepared using the procedures described in Example 1, with the exception that different alcohols were used at a level of 1 part by weight of alcohol per 1 part by weight of the resin. The coatings on silicone wafers were fabricated from the resulting solutions using the same procedures as in Example 1, and their Dk's were measured. The resulting Dk values and mole % of alcohol (based moles of alcohol used and moles of Si—H in the starting resin) are shown in Table 1, below.

TABLE 1

| Sample No. | Alcohol | Mole % Alcohol | Dk |
|---|---|---|---|
| 2-1 | 3,7 dimethyl-1-octanol | 25.2 | 2.5 |
| 2-2 | 1-dodecanol | 22.4 | 2.4 |
| 2-3 | 2-octyl-1-dodecanol | 15.1 | 2.2 |

The results of this example illustrate that the Dk varies with the alcohol used.

Example 3

Samples were prepared using the procedures described in Example 1, with the exception that the amount of 2-octyl- 1-dodecanol was varied. Coatings were made and their Dk's were measured. The parts by weight of the alcohol per 1 part per weight of the resin, mole % of alcohol (based moles of alcohol used and moles of Si—H in the starting resin), and the Dk's are listed in Table 2, below.

TABLE 2

Dk data for thin coatings made from alkoxyhydridosiloxane resins with various levels of alkoxy groups.

| Sample No. | Parts by weight of the alcohol | Mole % alcohol | Dk |
|---|---|---|---|
| 3-1 | 0.43 | 7.06 | 2.75 |
| 3-2 | 0.54 | 8.76 | 2.41 |
| 3-3 | 0.82 | 12.74 | 2.25 |
| 3-4 | 1.00 | 15.11 | 2.24 |
| 3-5 | 1.22 | 17.76 | 3.32 |
| 3-6 | 1.50 | 21.00 | 3.83 |

The results of this example illustrate that the Dk varies with the level of alkoxy functionality present in the alkoxyhydridosiloxane resin.

What is claimed is:

1. An alkoxyhydridosiloxane resin composition comprising $ROSiO_{3/2}$ siloxane units and $HSiO_{3/2}$ siloxane units wherein R is an alkyl group having 10 to 28 carbon atoms, wherein the alkoxyhydridosiloxane resin contains an average from 5 to 40 mole percent silicon bonded alkoxy groups, and wherein the alkoxyhydridosiloxane resin contains an average of at least 45 mole percent silicon bonded hydrogen atoms.

2. The alkoxyhydridosiloxane resin composition claimed as in claim 1, wherein the resin has a weight average molecular weight from 1000 to 150,000.

3. The alkoxyhydridosiloxane resin composition claimed as in claim 1, wherein the resin has a weight average molecular weight from 20,000 to 100,000.

4. The alkoxyhydridosiloxane resin composition claimed as in claim 1, wherein the alkoxyhydridosiloxane resin contains an average from 10 to 30 mole percent silicon bonded alkoxy groups.

5. The alkoxyhydridosiloxane resin composition claimed as in claim 1, wherein the alkoxyhydridosiloxane resin contains an average of at least 70 mole percent silicon bonded hydrogen atoms.

6. A method for preparing an alkoxyhydridosiloxane resin comprising:

(A) forming a reaction mixture comprising
(a) a hydridosiloxane resin having at least 50 mole percent silicon bonded hydrogen atoms,
(b) an alcohol having 10 to 28 carbon atoms,
(c) a solvent and
(d) a base catalyst;

(B) reacting the silicon bonded hydrogen with the alcohol for a time sufficient to effect formation of the alkoxyhydridosiloxane; wherein the alcohol is present in an amount such that the alkoxyhydridosiloxane resin contains an average from 5 to 40 mole percent silicon bonded alkoxy groups, and wherein the alkoxyhydridosiloxane resin contains an average of at least 45 mole percent silicon bonded hydrogen atoms.

7. The method as claimed in claim 6 where the hydridosiloxane resin is selected from the group consisting of $(HSiO_{3/2})_n$, and $(HSiO_{3/2})_x(H_2SiO)_y$, where n is greater than or equal to 8, x and y are a mole fraction in which x+y is equal to 1, and x is at least 0.5.

8. The method as claimed in claim 6, where the alcohol is a primary alcohol.

9. The method as claimed in claim 6, where the alcohol is selected from the group consisting of 1-decanol, 1-dodecanol, 1-octadecanol and 2-octyldodecanol.

10. The method as claimed in claim 6, wherein the hydridosiloxane resin has at least 70 mole percent silicon bonded hydrogen atoms.

11. The method as claimed in claim 6 wherein the reaction is at a temperature in a range from 20° C. to 150° C.

12. The method as claimed in claim 6 wherein the reaction is at a temperature in a range from 50° C. to 100° C.

13. The method as claimed in claim 6 wherein the base catalyst is neutralized with an acid after the reaction.

14. A method of forming a nanoporous coating on a substrate comprising the steps of (A) coating the substrate with a coating composition comprising an alkoxyhydridosiloxane resin comprising $ROSiO_{3/2}$ siloxane units and $HSiO_{3/2}$ siloxane units wherein R is an alkyl group having 10 to 28 carbon atoms, wherein the alkoxyhydridosiloxane resin contains an average from 5 to 40 mole percent of silicon bonded alkoxy groups, and wherein the alkoxyhydridosiloxane resin contains an average of at least 45 mole percent of silicon bonded hydrogen atoms;

(B) heating the coated substrate to a temperature sufficient to effect curing of the coating composition, and (C) further heating the cured coated substrate to a temperature sufficient to effect thermolysis of the alkoxy groups of the alkoxyhydridosiloxane thereby forming a nanoporous silicon coating on the substrate.

15. The method as claimed in claim 14, where the heating and thermolysis is done in a single step.

16. The method as claimed in claim 14, where the thermolysis of alkoxy substituents is conducted at a temperature within a range of greater than 350° C. to 600° C.

17. The method as claimed in claim 14 wherein the alkoxyhydridosiloxane resin contains an average from 10 to 30 mole percent silicon bonded alkoxy groups and wherein the alkoxyhydridosiloxane resin contains an average of at least 70 mole percent of silicon bonded hydrogen atoms.

18. A substrate having a nanoporous coating prepared by the method of claim 14.

19. An electronic substrate having a nanoporous coating prepared by the method of claim 14.

20. The electronic substrate claimed as in claim 19 wherein the nanoporous coating has a dielectric constant from 1.3 to 3.

* * * * *